United States Patent [19]
Lee

[11] Patent Number: 5,748,123
[45] Date of Patent: May 5, 1998

[54] DECODING APPARATUS FOR MANCHESTER CODE

[75] Inventor: Wonro Lee, Seoul, Rep. of Korea

[73] Assignee: LG Semicon Co., Ltd., Cheongju, Rep. of Korea

[21] Appl. No.: 587,741

[22] Filed: Jan. 19, 1996

[51] Int. Cl.$^6$ ........................................ H03M 7/12
[52] U.S. Cl. .................... 341/70; 341/50; 341/68
[58] Field of Search ........................ 341/70, 68, 50

[56] References Cited

U.S. PATENT DOCUMENTS

| | | |
|---|---|---|
| 3,979,746 | 9/1976 | Jarrett . |
| 4,185,273 | 1/1980 | Gowan ........................... 340/347 DD |
| 4,292,626 | 9/1981 | Smithlin ........................ 340/347 DD |
| 4,525,848 | 7/1985 | Simpson . |
| 4,542,420 | 9/1985 | Kozlik et al. . |
| 4,675,884 | 6/1987 | Nakamura et al. . |
| 4,688,232 | 8/1987 | Fox . |
| 4,745,626 | 5/1988 | Wells . |
| 4,788,605 | 11/1988 | Spiesman et al. . |
| 4,862,482 | 8/1989 | Patchen . |
| 4,881,059 | 11/1989 | Saltzberg ............................ 341/70 |
| 4,905,257 | 2/1990 | Palkert et al. . |
| 5,023,891 | 6/1991 | Johnson, III ....................... 375/87 |
| 5,056,114 | 10/1991 | Wight . |
| 5,127,023 | 6/1992 | Tash et al. ........................... 375/55 |
| 5,163,067 | 11/1992 | Wight et al. ........................ 375/87 |
| 5,168,511 | 12/1992 | Boles . |
| 5,276,716 | 1/1994 | Wincn . |

*Primary Examiner*—Fritz Fleming
*Assistant Examiner*—Jason L W Kost
*Attorney, Agent, or Firm*—Fleshner & Kim

[57] ABSTRACT

An improved decoding apparatus for a Manchester code receives an asynchronous Manchester code, synchronizes to a received clock signal, and decodes an output NRZ code and an output synchronous clock signal. A first decoding unit samples an asynchronous Manchester code by synchronizing the asynchronous Manchester code to a shift of a received clock signal to produce a synchronous Manchester code and a synchronous clock, and computes an NRZ code. A tolerance check unit receives the synchronous Manchester code and checks a tolerance with respect to a shift at a bit cell center of the synchronous Manchester code. A multiplexer unit receives the NRZ code and the synchronous clock signal and selectively outputs a multiplexed NRZ code and a multiplexed synchronous clock signal in accordance with a detection signal outputted from the tolerance check unit. A synchronous signal detection unit receives the multiplexed NRZ code and the multiplexed synchronous clock signal and outputs a sync detection signal; and a second decoding unit receives the multiplexed NRZ code and the multiplexed synchronous clock signal and computes the output NRZ data and the output synchronous clock signal in accordance with the sync detection signal.

12 Claims, 7 Drawing Sheets

DECODING APPARATUS FOR MANCHESTER CODE

BACKGROUND OF THE INVENTION

1. Field of the Invention

The present invention relates to a decoding apparatus for a Manchester code, and particularly to an improved decoding apparatus for a Manchester code capable of receiving a nonsynchronous Manchester code, synchronizing to a receiving clock signal, and decoding to a none-return to zero (NRZ) code and a synchronous clock signal.

2. Description of the Conventional Art

Generally, a Manchester encoding is directed to combining a serial binary data and a synchronized clock signal to produce a single signal between synchronous communication systems. That is, it is performed by exclusively ORing a binary data NRZ and a transmission clock signal of 50% of synchronized dubiety.

As a result of the Manchester encoding operation, a logic "1" of the NRZ data is expressed as "1, 0" in a binary bit code of which the first digit is a high level and the second digit is a low level, and a logic "0" is expressed as "0, 1" of which the first digit is a low level and the second digit is a high level. That is, the above-mentioned code conversion is performed in the Manchester code of a binary bit code.

Figure 1:
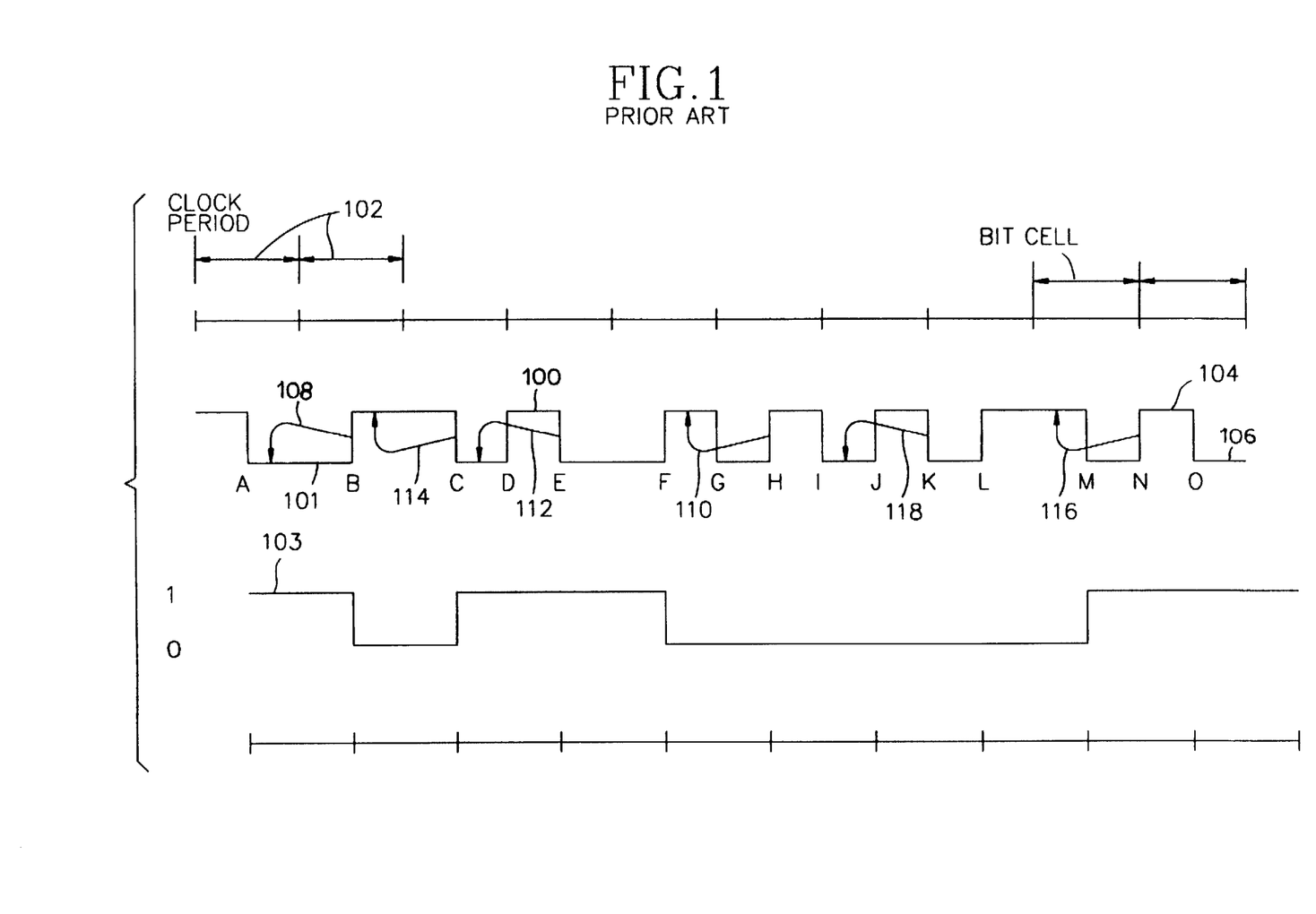
FIG. 1 is a wave form of a conventional Manchester code.

In addition, FIG. 1 shows a wave form 100 of a typical Manchester code having a clock cycle 102, each clock cycle 102 is defined to include a data bit cell having a high level code bit cell 104 and a low level code bit cell 106, and each data bit cell includes decreasing edge shifts "A, C, E, G, I, K, M, O" and increasing edge shifts B, D, F, H, J, L, and N.

In addition, a shift which occurs at a central portion of each clock cycle 102 is directed to transmitting a corresponding data, and shifts D, G, I, K, and N which occur at an increasing edge of each clock cycle is not referred to the transmission of the data.

Therefore, a communication system receiving the above-mentioned code 100 detects a shift point which occurs at a central portion of each clock cycle 102, fits a synchronous Manchester code, and decodes to the NRZ data 103 and the receiving clock signal RxCLK.

Figure 2:
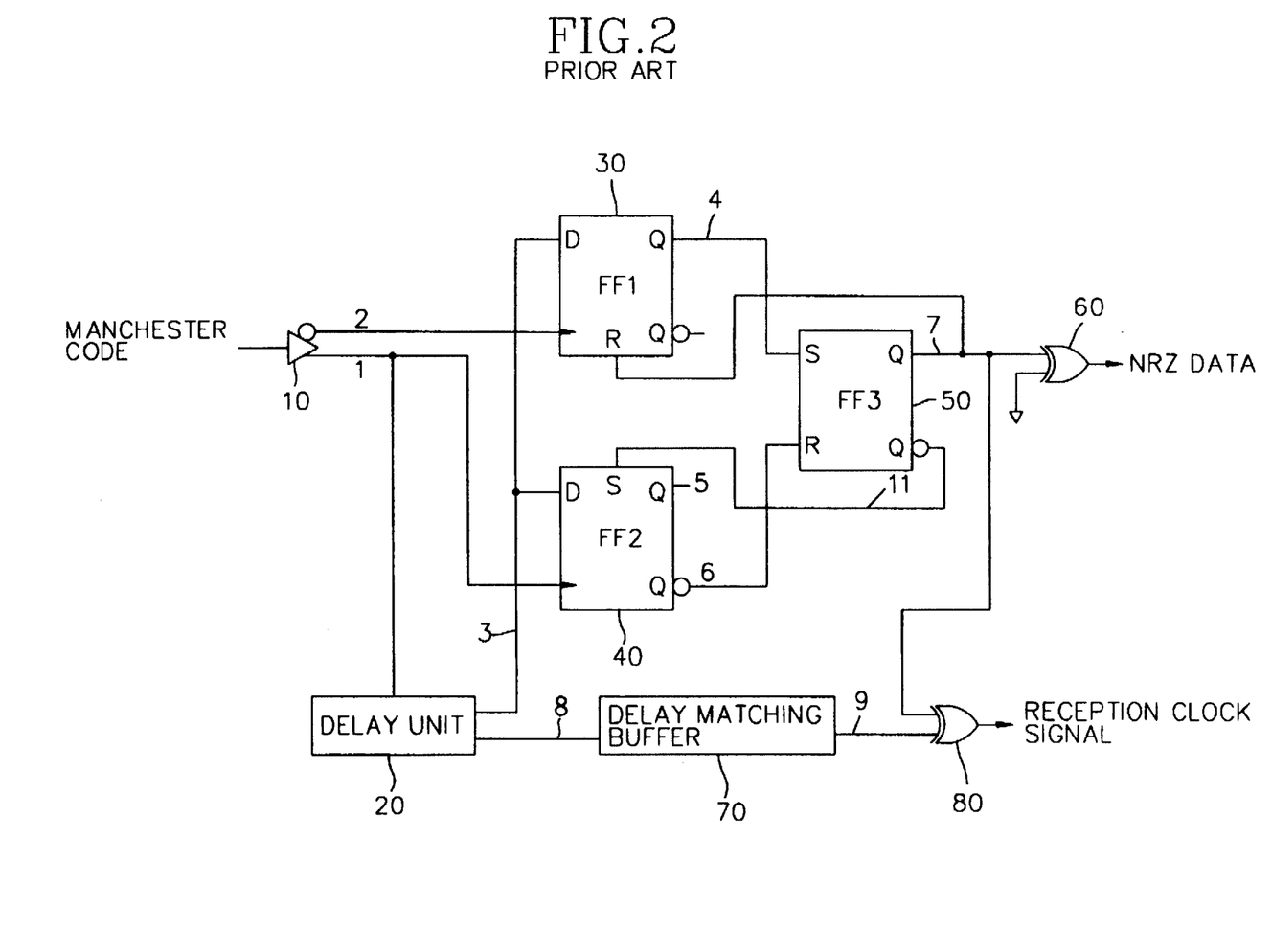
FIG. 2 is a clock diagram of a conventional Manchester decoding apparatus.

FIG. 2 shows a conventional Manchester decoding apparatus, which includes a buffer 10 for receiving a Manchester code through an input terminal and for outputting a noninverted Manchester code 1 and an inverted Manchester code 2, a delay device 20 for receiving the non-inverted Manchester code 1 outputted from the buffer 10 and for delaying the Manchester code 1 by a ½ code cycle 8 and a ¾ code cycle 3, respectively, a first flipflop 30 for receiving the inverted Manchester code 2 outputted from the buffer 10 through a clock terminal and for sampling the Manchester code delayed by the ¾ code cycle 3 outputted from the delay device 20 and for outputting a shift detection signal 4, a second flipflop 40 for receiving the noninverted Manchester code 1 outputted from the buffer 10 through a clock terminal and for sampling the Manchester code delayed by the ¾ code cycle 3 by the delay device at an increasing edge of the noninverted Manchester code and for outputting a shift detection signal 6, an SR flipflop 50 for outputting an NRZ code 7 set by the shift detection signal outputted from the first flipflop 30 to a reset terminal R of the flipflop 30 and for receiving and inverting the shift detection signal outputted from the flipflop 40 through the reset terminal R, and for outputting the thusly inverted signal 11 to a set terminal S of the flipflop 40, an exclusive OR-gate 60, of which one end thereof is connected to the ground and the other end thereof is directed to receiving an NRZ code outputted from a noninverted output terminal Q 7 of the flipflop 50, for exclusively ORing the thusly received NRZ code and for outputting the decoded NRZ data, a delay matching buffer 70 for receiving the Manchester code delayed by a ½ clock cycle 8 by the delay device 20, and an exclusive OR-gate 80 for receiving the Manchester code delayed by the delay matching buffer 70 through one end thereof 9 and for receiving the NRZ code 7 outputted from the noninverted output terminal Q of the SR flipflop 50 through the other end thereof and for generating a receiving clock Rx CLK.

The operation of the conventional decoding apparatus for a manchester code will now be explained with reference to FIGS. 1 through 3.

Figure 3:
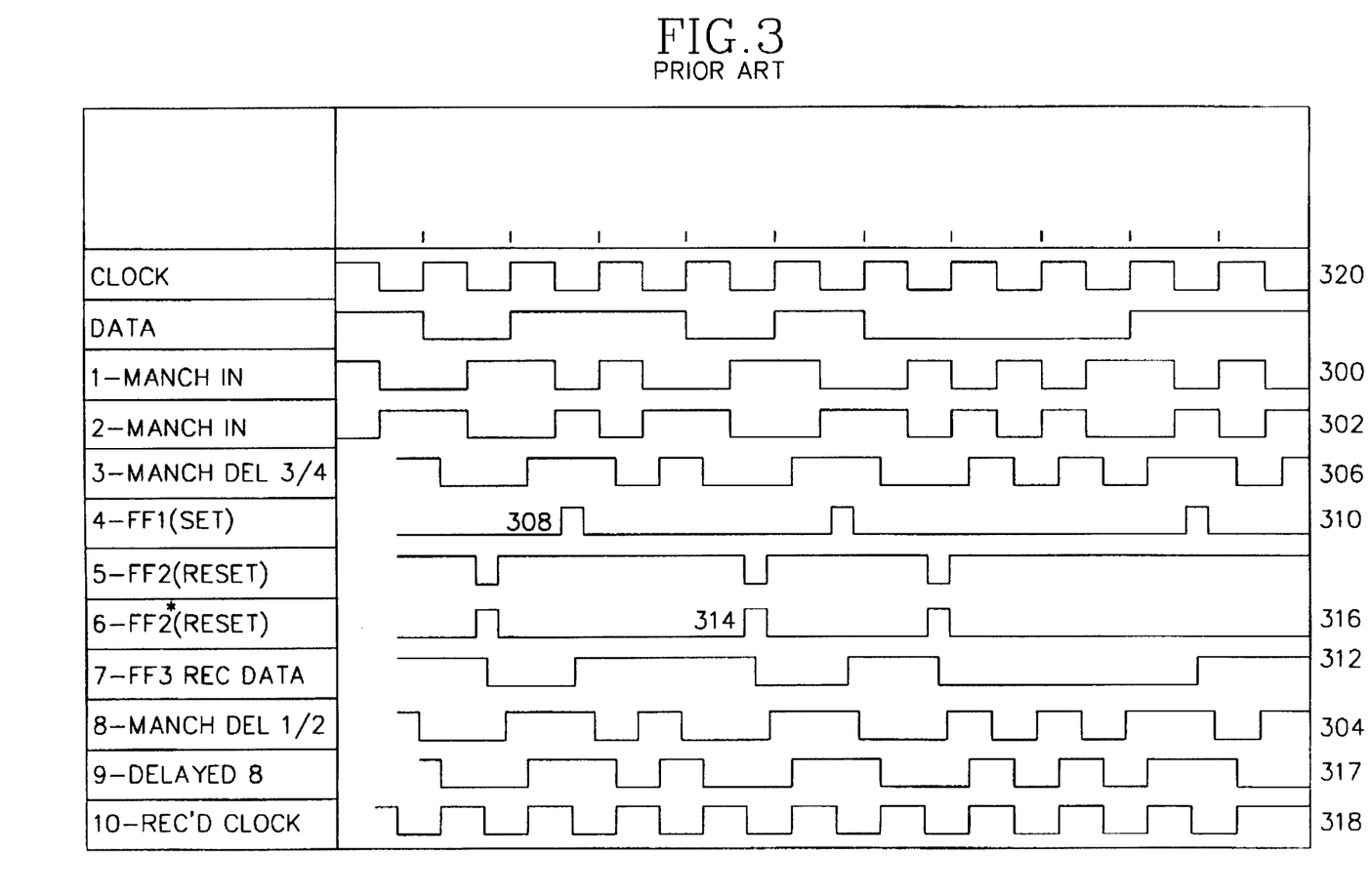
FIG. 3 is a view of a timing of each element of FIG. 2.

To begin with, when a Manchester code 300 as shown in FIG. 3 is inputted, the received Manchester code 300 is bufferred and amplified by the buffer 10 of the Manchester decoding apparatus 200. The noninverted Manchester code 300 is inputted to the delay device 20 and the second flipflop 40, respectively, and the inverted Manchester code 302 is inputted to the first flipflop 30.

Thereafter, the delay device 20 receives the noninverted Manchester code 300 from the buffer 10 and delays by a ¾ clock cycle and a ½ clock cycle of the Manchester code 300, and the ¾ clock cycle-delayed Manchester code 306 is outputted to the input terminal D of the first flipflop 30 and the second flipflop 40, and the ½ clock cycle-delayed Manchester code 304 is outputted to the delay matching buffer 70.

At this time, the Manchester code 300 generates a shift at a central portion of all of the data cells, and since the first flipflop 30 and the second flipflop 40 is referred to a circuit which is operated at an increasing shift of a signal inputted to the clock terminals, the flipflip 30 and the flipflop 40 are varied in accordance with an edge or a shift state detected at the central portion of each data cell, and the output thereof is not varied by an edge or a shift which are indicated at boundaries of each data cell.

Thereafter, the first flipflop 30 receives the inverted Manchester code 302 outputted from the buffer 10 through the clock terminal and samples the Manchester code 306 delayed by a ¾ clock cycle by the delay device 20 at an increasing shift and outputs the shift detection signal 310 to the set terminal S of the SR flipflop 50.

Thereafter, the flipflop 40 receives the noninverted Manchester code 300 outputted from the buffer 10 through the clock terminal and samples the Manchester code 306 delayed by a ¾ clock cycle by the delay device at an increasing shift and outputs the shift detection signal to the reset terminal R of the SR flipflop 50.

Thereafter, the first flipflop 30 and the second flipflop 40 output a shift detection signal in accordance with the following rules. That is, a shift detection signal 103 is outputted as shown in FIG. 1.

A. When a shift detected at the central portion of the clock cycle 102 of the Manchester code wave form 100 is an increasing shift B, and when the state of the wave form 100 is a low level during a binary code bit cell (as indicated as the arrow 108), the shift detection signal is changed from a high level to a low level.

B. When the detected shift is an increasing shift H, and when the state of a wave form 100 during a binary code bit cell is a high level (as indicated as the arrow 110 and 116), the shift detection signal maintains a previous state.

C. When the detected shift is a decreasing shift E, and when the state of a wave form 100 is a low level during the binary code bit cell (as indicated as the arrow 112 and 118), the shift detection signal maintains a previous state.

D. When the detected shift is a decreasing shift C, and when the state of a wave form 100 is a high level during the binary code bit cell (as indicated as the arrow 114), the shift detection signal is changed from the low level to a high level.

Therefore, according to the above-mentioned rule, when the first flipflop 30 samples the Manchester code 306 which is delayed by a ¾ clock cycle at an increasing shift of the inverted Manchester code 302, that is, at a decreasing shift of the Manchester code 300, when the sampled data is "1", the Manchester code 300 maintains the state of "1" during the following binary code bit cell, and the flipflop 30 changes the shift detection signal from "0" to "1" (at the point 308 of the signal 310) and outputs to the terminal S of the SR flipflop 50, and the SR flipflop 50 is set to "1" and outputs the NRZ code of a high level through the noninverted output terminal Q so as to reset the first flipflop 30, and the shift detection signal outputted from the noninverted output terminal Q of the flipflop 30 is outputted as "0".

Meanwhile, when the data sampled at a decreasing shift of the Manchester code 300 is "0", since the Manchester code 300 is not the state of "1" during the following binary bit cell, the flipflop 30 maintains a state of "0" and outputs a shift detection signal "0" to the noninverted output terminal Q.

Thereafter, the second flipflop 40 samples the Manchester code 306 delayed by a ¾ clock cycle at an increasing shift of the noninverted Manchester code 300. Here, when the sampled data is "0", the noninverted Manchester code 300 maintains a state of "0" during a following binary code bit cell, and the flipflop 30 changes the shift detection signal state from "1" to "0" and outputs to the reset terminal R of the SR flipflop 50, and the SR flipflop 50 is reset to a detection signal "1" and outputs a high level signal through the inverted output terminal so as to set the second flipflop 40, and the inverted output terminal Q of the flipflop 40 outputs a shift detection signal of "0".

Meanwhile, when the data sampled at an increasing shift is "1", since the Manchester code 300 is not "0" during the following binary code bit cell, the flipflop 40 maintains a state of "1" and outputs "0" through the inverted output terminal Q. This occasion occurs when the flip[flop 40 samples a Manchester code at an increasing shift which is located at a boundary of the data cells.

Thereafter, the third flipflop 50 noninverts the NRZ code in accordance with a shift detection signal outputted from the first flipflop 30 and the second flipflop 40, and the exclusive OR-gate 60, of which one end thereof is connected to the ground, receives the NRZ code outputted from the SR flipflop 50 through the other end thereof and ORs the thusly received code and outputs an NRZ data.

In addition, the delay matching buffer 70 receives a Manchester code 304 delayed by the delay device 20 by a ½ clock cycle and outputs the matching signal 317 delayed by a signal delay due to a delay time of each device of the flipflops 30 and 40 to one end of the exclusive OR-gate 80, and the exclusive OR-gate 80 receives an NRZ code noninverted by the flipflop 50 and receives a matching signal 317 outputted from the delay matching buffer 70 through the other end thereof and exclusively ORs the thusly received code and signal and outputs a receiving clock signal Rx_CLK.

However, the conventional Manchester decoding apparatus adopts a phase-locked loop (PLL) to receive the shifted Manchester code and to match a synchronous state. When the PLL is not adopted, a process of delaying the Manchester code is necessary, so that the chip size is increased and more accurate fabrication processes are necessary, thus decreasing productivity.

SUMMARY OF THE INVENTION

Accordingly, it is an object of the present invention to provide a decoding apparatus for a Manchester code, which overcome the problems encountered in a conventional decoding apparatus for a Manchester code.

It is another object of the present invention to provide an improved decoding apparatus for a Manchester code capable of receiving a nonsynchrounous Manchester code, synchronizing to a receiving clock signal, and decoding to an NRZ code and a synchronous clock signal.

To achieve the above objects there is provided a decoding apparatus for a Manchester code, comprising a first decoding unit for sampling an asynchronous Manchester code by synchronizing the asynchronous Manchester code to a shift of a received clock signal to produce a synchronous Manchester code, computing a synchronous clock signal by dividing the received clock signal by an integer, XORing the synchronous Manchester code and the synchronous clock signal, and computing an NRZ code; a tolerance check unit for receiving the synchronous Manchester code from said first decoding unit, sequentially detecting a tolerance bit value shifted in accordance with the synchronous clock signal, and checking a tolerance with respect to a shift at a bit cell center of the synchronous Manchester code; a multiplexer unit for receiving the NRZ code and the synchronous clock signal outputted from said first decoding unit and for selectively outputting a multiplexed NRZ code and a multiplexed synchronous clock signal in accordance with a detection signal outputted from said tolerance check unit; a synchronous signal detection unit for receiving the multiplexed NRZ code and the multiplexed synchronous clock signal outputted from said multiplexer unit and for detecting a synchronous bit value of the multiplexed NRZ code shifted in accordance with the multiplexed synchronous clock signal and for outputting a sync detection signal; and a second decoding unit for receiving the multiplexed NRZ code and the multiplexed synchronous clock signal outputted from said multiplexer unit and for computing the output NRZ data and the output synchronous clock signal in accordance with the sync detection signal outputted from the synchronous signal detection unit.

DETAILED DESCRIPTION OF THE INVENTION

Figure 4:
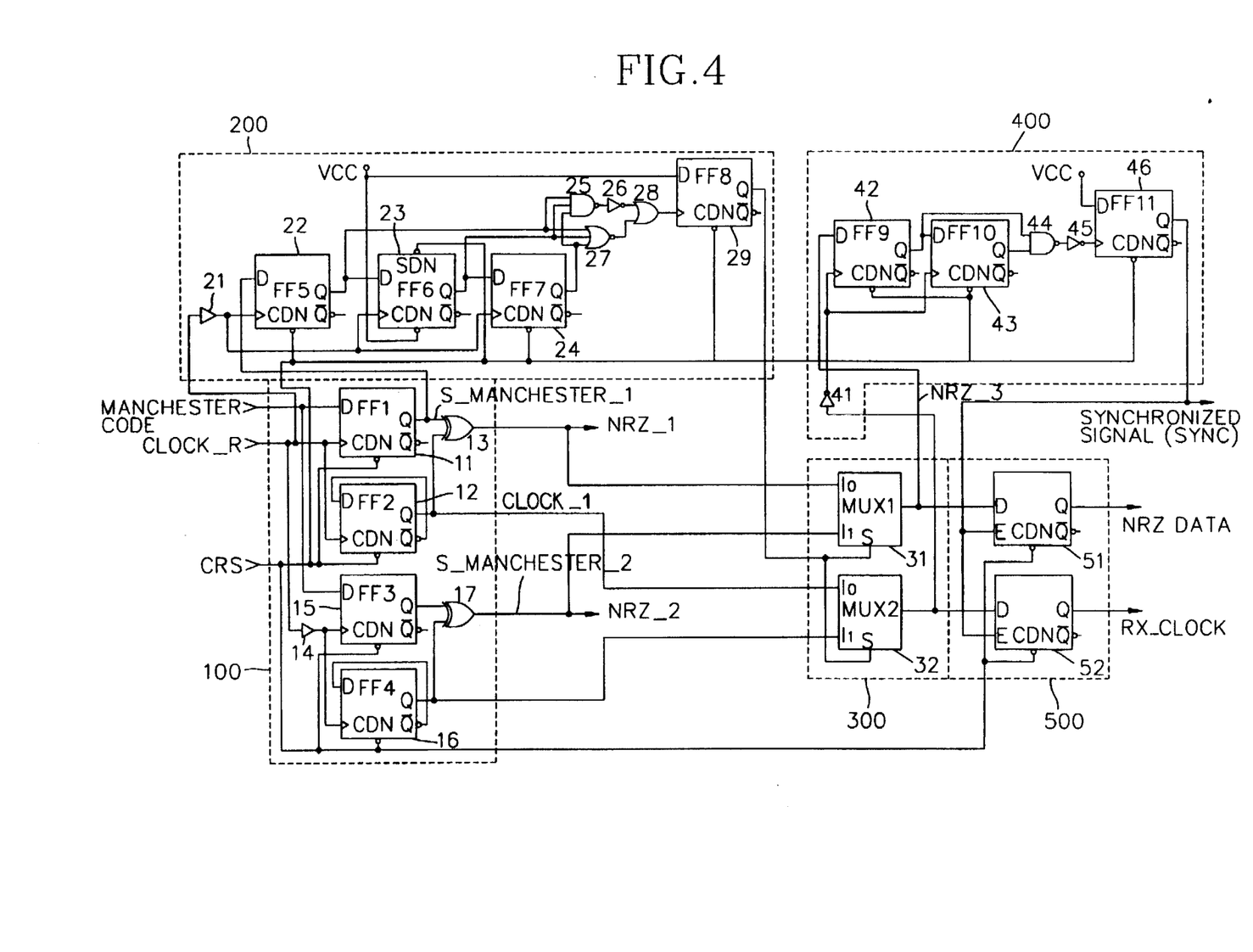
FIG. 4 is a block diagram of a Manchester decoding apparatus according to the present invention.

FIG. 4 shows a Manchester decoding apparatus according to the present invention, which includes a first decoding unit 100 for sampling a synchronous Manchester code by synchronizing a transmitted nonsynchrounous Manchester code to a shift of a clock signal CLOCK_R and for dividing the clock signal CLOCK_R and for computing the synchronous signal and for exclusively ORing the synchronous Manchester code and the synchronous signal and for outputting an NRZ code, a checking unit 200 for receiving a synchronous code from the first decoding unit 100 and for sequentially detecting a bit value shifted in accordance with a clock signal and for checking a tolerance with respect to the shift at a bit cell central portion, a multiplexer 300 for selectively selecting an NRZ code and a synchronous signal outputted from the first decoding unit in accordance with a detection signal outputted from the tolerance checking unit 200, a synchronous signal detecting unit 400 for receiving the NRZ code and the synchronous signal from the multiplexer 300 and for detecting a bit value of an NRZ code which is shifted in accordance with a synchronous signal Sync, and a second decoding unit 500 for receiving an NRZ code and a synchronous signal Sync from the multiplexer 300 and for outputting an NRZ data and a receiving clock signal Rx_CLK in accordance with a synchronous signal Sync outputted from the synchronous signal detecting unit 400.

The first decoding unit 100 includes a first flipflop 11 for receiving the nonsynchronous Manchester code MANCHESTER_CODE and the clock signal CLOCK_R and for sampling the synchronous Manchester code at an increasing edge of the clock signal CLOCK_R and for noninverting the synchronous Manchester code; a second flipflop 12 for holding the synchronous signal noninverted in accordance with the clock signal and for noninverting the ½ divided synchronous signal; an exclusive OR-gate 13 for exclusively ORing the synchronous Manchester code outputted from the first flipflop S_MANCHESTER_1 by receiving it through one end thereof and the synchronous clock signal CLOCK_1 outputted from the second flipflop 12 by receiving it through the other end thereof and for outputting an NRZ code NRZ_1; a third flipflop 15 for receiving the nonsynchronous Manchester code and the clock signal CLOCK_R inverted by the inverter 14 and for sampling the synchronous Manchester code at an increasing edge of the inverted clock signal CLOCK_R; a fourth flipflop 16 for holding the synchronous signal inverted and outputted in accordance with an inverting clock signal CLOCK_R and for noninverting the ½ divided synchronous signal CLOCK_2; and an exclusive OR-gate 17 for exclusively ORing the synchronous Manchester code S_MANCHESTER_2 outputted from the third flipflop 15 by receiving it through one terminal and the synchronous clock signal CLOCK_2 outputted from the fourth flipflop 16 by receiving it through the other terminal thereof and for outputting an NRZ code NRZ_2.

The tolerance checking unit 200 includes a buffer 21 for buffering the clock signal CLOCK_R; a fifth flipflop 22 for receiving a synchronous Manchester code S_MANCHESTER_1 from the first flipflop 11 and for sequentially shifting the bit value of the synchronous Manchester code S_MANCHESTER_1 by one bit in accordance with a clock signal CLOCK_R outputted from the buffer 21; a sixth flipflop 23 for receiving the synchronous Manchester code S_MANCHESTER_1 shifted from the fifth flipflop 22 and for sequentially shifting the bit value of the synchronous Manchester code S_MANCHESTER_1 by one bit in accordance with a clock signal CLOCK_R outputted from the buffer 21; a seventh flipflop for receiving the synchronous Manchester code S_MANCHESTER_1 shifted from the sixth flipflop 23 and for sequentially shifting the bit value of the synchronous Manchester code S_MANCHESTER_1 by one bit in accordance with a clock signal CLOCK_R outputted from the buffer 21; a NAND-gate for receiving the bit values shifted by the fifth flipflop 22, the sixth flipflop 23, and the seventh flipflop 24 and for detecting the bit values "1, 1, 1"; an inverter 26 for inverting the detection signal of the NAND-gate 25; a NOR-gate 27 for receiving the bit values shifted at the noninverted terminal Q of the fifth flipflop 22, the sixth flipflop 23, and the seventh flipflop 24 and for detecting a bit value "0, 0, 0"; an OR-gate 28 for receiving the detection signal inverted by the inverter 26 through one terminal thereof and for receiving the detection signal outputted from the NOR-gate 27 though the other terminal thereof and for checking a specification (tolerance) of the dubiety of the synchronous Manchester code S_MANCHESTER_1; and an eighth flipflop 29 for noninverting the voltage Vcc to a control signal in accordance with an output signal of the OR-gate 28.

The multiplexer 300 includes a first multiplexer 31 for receiving NRX codes NRZ_1 and NRZ_2 from the XOR-gates 13 and 17 of the first decoding unit 100 and for selectively outputting the NRZ_3 code in accordance with a control signal outputted from the tolerance checking unit 200; and a second multiplexer 32 for receiving synchronous signals CLOCK_1 and CLOCK_2 from the second and fourth flipflops 12 and 16 and for selectively outputting a synchronous signal in accordance with a control signal outputted from the tolerance checking unit 200.

The synchronous detection unit 400 includes an inverter 41 for inverting the synchronous clock signal outputted from the second multiplexer 32; a ninth flipflop 42 for sequentially shifting the bit values of the NRZ code NRZ_3 outputted from the first multiplexer 31 by one bit in accordance with an inverted synchronous clock signal, a tenth flipflop 43 for receiving the NRZ code NRZ_3 shifted by the ninth flipflop 42 in accordance with a synchronous clock signal inverted by the inverter 41 and for shifting the bit values by one bit; a NAND-gate 44 for receiving the bit value shifted by the tenth flipflop 43 through one terminal and for receiving the bit value shifted by the ninth flipflop 42 and for detecting a synchronous bit value; an inverter 45 for inverting the output of the NAND-gate 44; and an eleventh flipflop 46 for outputting the voltage Vcc as a synchronous signal SYNC in accordance with the output signal of the inverter 45.

The second decoding unit 500 includes a latch device 51 for receiving an NRZ code outputted from the first multiplexer 31 and for outputting an NRZ data in accordance with a synchronous signal SYNC outputted from the eleventh flipflop 46, and a latch device 52 for receiving a synchronous signal SYNC outputted from the second multiplexer 32 and for outputting a receiving clock signal Rx_CLK in accordance with a synchronous signal SYNC outputted from the eleventh flipflop 46.

In addition, a carrier sense (CRS) signal is commonly inputted to the inverted CDN terminal of all of the flipflops except for an SDN terminal SDN of the sixth flipflop 23, and Vcc is applied to the inverted CDN terminal CDN of the sixth flipflop 23.

The operation of a Manchester encoding apparatus according to the present invention will now be explained with reference to FIGS. 4 through 7.

Figure 5:
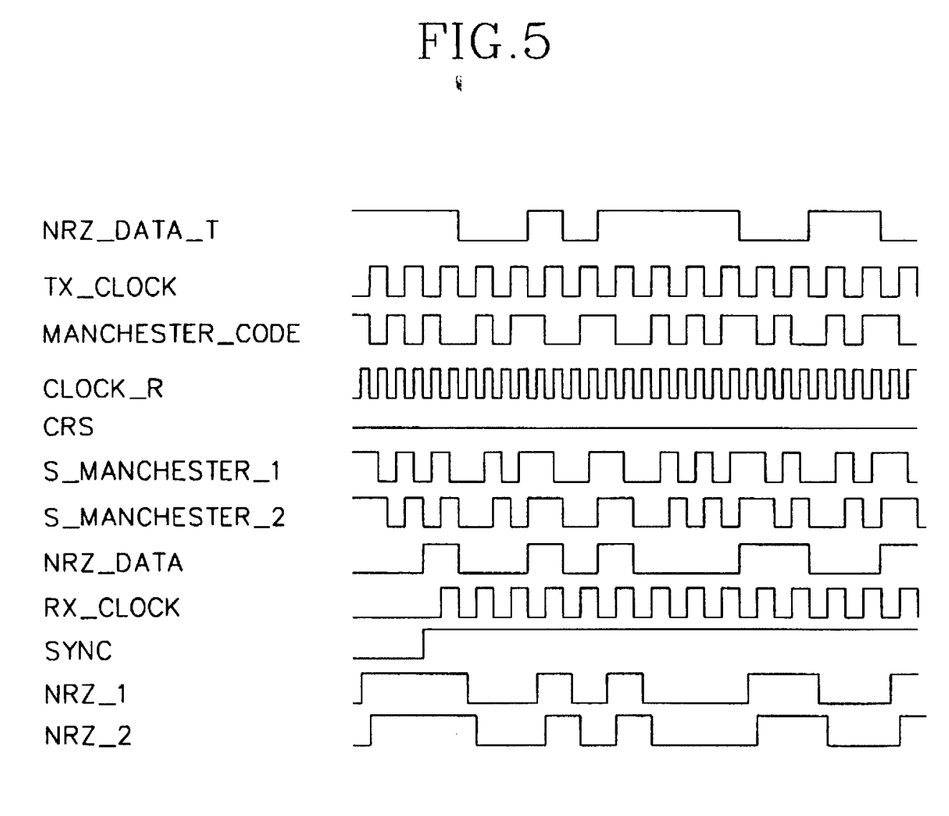
FIG. 5 is a view of a timing of each element when an ideal shift of a received nonsynchronous Manchester code is performed of FIG. 4 according to the present invention.

To begin with, as shown in FIG. 5, when a nonsychronous code of 10 bps is transmitted to the receiving side, the externally applied CRS signal is changed from a low level to a high level, and is applied to the inverted CDN terminals of all of the flipflops except for an inverted SDN terminal SDN of the sixth flipflop 23 and the sixth flipflop 23, and all of the flipflops are enabled.

Thereafter, the first flipflop 11 receives a nonsynchronous Manchester code of 10 bps and a clock signal of 20 Mhz and samples the nonsynchronous Manchester code MANCHESTER_CODE at an increasing edge of the clock signal of 20 Mhz and outputs a synchronized Manchester code, and the second flipflop 12 holds a synchronous clock signal inverted in accordance with a clock signal CLOCK_R of 20 Mhz to an input terminal D and outputs a ½ divided synchronous signal CLOCK_1 of 10 Mhz.

Therefore, the exclusive OR-gate 13 XORs the synchronous Manchester code S_MANCHESTER_1 outputted from the first flipflop 11 through one terminal and the synchronous clock signal CLOCK_1 outputted from the second flipflop from the other terminal and outputs an NRZ code NRZ_1.

In addition, the third flipflop 15 receives a nonsynchronous Manchester code MANCHESTER_CODE of 10 Mbps and a clock signal CLOCK_R of 20 Mhz inverted by the inverter 14, and samples the synchronous Manchester S_MANCHESTER_2 at an increasing edge of the clock signal CLOCK_R of 20 Mhz and outputs a synchronous Manchester code, and the fourth flipflop 16 holds a synchronous clock signal inverted in accordance with an inverted clock signal CLOCK_R of 20 Mhz through an input terminal D and outputs a ½ synchronous clock signal CLOCK_2 of 10 Mhz.

Therefore, the exclusive OR-gate 17 XORs a synchronous Manchester code S_MANCHESTER_2 outputted from the third flipflop 15 through one terminal thereof and a synchronous clock signal CLOCK_2 outputted from the fourth flipflop 16 through the other terminal thereof and outputs an NRZ code NRZ_2.

Thereafter, the buffer 21 of the tolerance checking unit 200 buffers the clock signal CLOCK_R of 20 Mhz, and the fifth flipflop 22 receives the clock signal CLOCK_R of 20 Mhz outputted from the buffer 21 and the synchronous Manchester code S_MANCHESTER_1 outputted from the first flipflop 11, shifts sequentially the bit value of the synchronous Manchester code S_MANCHESTER_1 at an increasing edge of the clock signal CLOCK_R of 20 Mhz by one bit, and the sixth flipflop 23 receives the synchronous Manchester code S_MANCHESTER_1 shifted by the fifth flipflop 22 in accordance with a clock signal CLOCK_R of 20 Mhz outputted from the buffer 21 and sequentially shifts the bit value by one bit, and the seventh flipflop 24 receives the synchronous Manchester code S_MANCHESTER_1 shifted by the sixth flipflop 21 in accordance with a clock signal CLOCK_R of 20 Mhz outputted from the buffer 23 and sequentially shifts the bit value by one bit.

Thereafter, the NAND-gate 25 receives the bit value of the synchronous Manchester code S_MANCHESTER_1 shifted by the fifth flipflop 22, the sixth flipflop 23, and the seventh flipflop 24 and detects the bit value "1, 1, 1" of which the dubiety of the received Manchester code is deviated from the specification, and the NOR-gate 27 receives the bit values of the synchronous Manchester code S_MANCHESTER_1 shifted by the fifth flipflop 22, the sixth flipflop 23, and the seventh flipflop 24 and detects the bit value "0, 0, 0" of which the dubiety of the received Manchester code is deviated from the specification.

Figure 6:
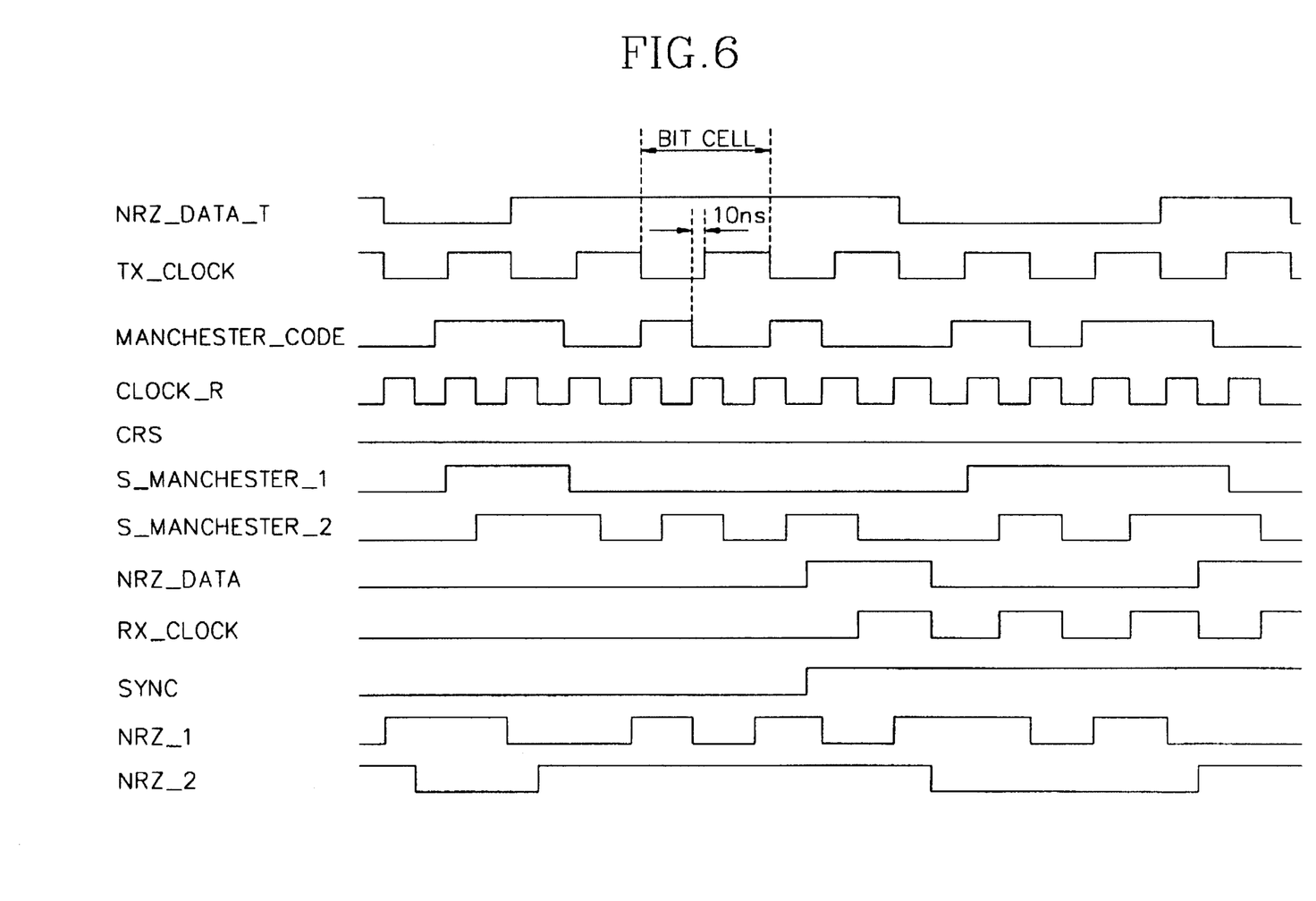
FIG. 6 is a view of a timing of each element when a received nonsynchronous Manchester code is shifted 120 ns before of FIG. 4 according to the present invention.
Figure 7:
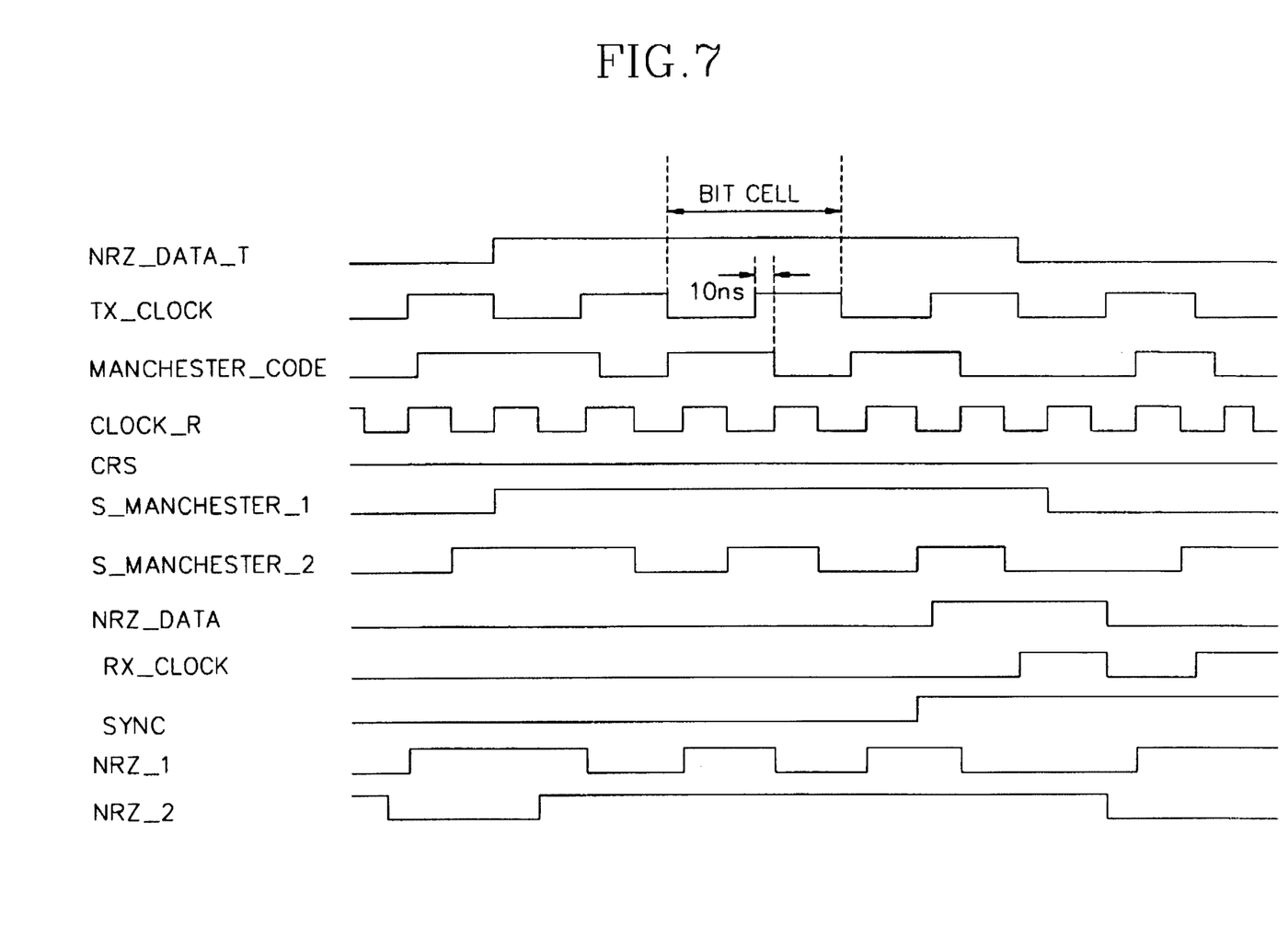
FIG. 7 is a view of a timing of each element when a received nonsynchronous Manchester is shifted 10 ns after.

That is, as shown in FIGS. 6 and 7, in case that a shift, which occurs at a central portion of the bit cell of the transmitted nonsynchronous Manchester code, occurs 10 ns before or after, since the bit value of the synchronous code S_MANCHESTER_1 may be a high level over 100 ns or a low level over 100 ns, the states "1, 1, 1" and "0, 0, 0" are detected, and the output of the multiplexer 300 is controlled, so that the correctly sampled synchronous Manchester code is selected.

Thereafter, the OR-gate 28 receives a detection signal of the NAND-gate 25 outputted from the inverter through one terminal and receives a detection signal outputted from the NOR-gate 27 through the other terminal and detects the dubiety of the Manchester code is deviated from the tolerance specification and outputs to the clock terminal of the eighth flipflop, and the eighth flipflop 29 outputs the voltage Vcc to the first multiplexer 31 of the multiplexer 300 and the strobe terminal S of the second multiplexer 32 as a control signal in accordance with a detection signal of the OR-gate 28.

That is, when the output value of the OR-gate 28 is "1", the eighth flipflop 29 noninverts a high level control signal so that the bit value of the Manchester code can be detected at a decreasing edge, and in case that the output value of the OR-gate 28 is "0", that is, the dubiety of the synchronous Manchester code is normal, the eighth flipflop 29 noninverts a low level control signal so that the bit value of the Manchester code can be detected at an increasing edge.

Therefore, the first multiplexer 31 of the multiplexer 300 receives an NRZ code NRZ_1 outputted from the exclusive OR-gate 13 and receives the NRZ code NRZ_2 outputted from the exclusive OR-gate 17 through the input terminal I1, and when a control signal inputted from the eighth flipflop 29 to the strobe terminal S is a low level, and the first multiplexer 31 thereof outputs an NRZ code NRZ_1 detected at an increasing edge of the receiving clock signal CLOCK_R of 20 Mhz, and when a control signal inputted to the strobe terminal S is a high level, it outputs an NRZ code NRZ_2 detected at a decreasing edge of the inverted receiving clock signal CLOCK_R of 20 Mhz.

In addition, the second multiplexer 32 receives the synchronous signal CLOCK_1 of 10 Mhz outputted from the second flipflop 12 through the input terminal I0 and receives the synchronous signal CLOCK_2 of 10 Mhz outputted from the fourth flipflop 16 through the input terminal I1, and when the control signal inputted to the strobe terminal S ia low level, the second multiplexer 32 outputs the synchronous signal CLOCK_1, and when the control signal inputted to the strobe terminal S is a high level, it outputs the synchronous signal CLOCK_2.

To begin with, when the control signal inputted to the strobe terminal S is a high level, the ninth flipflop 42 of the synchronous bit detection unit 400 receives the NRZ code NRZ_2 outputted from the first multiplexer 31 through the input terminal D, and receives the synchronous signal CLOCK_2 outputted from the second multiplexer 32 through the inverter 41 and the clock terminal thereof, and sequentially noninverts the bit value of the NRZ code NRZ_2 by one bit in accordance with the synchronous clock signal CLOCK_2, and the tenth flipflop 43 receives the synchronous clock signal CLOCK_2 inverted by the inverter 41 and sequentially receives the bit value of the NRZ code NRZ_2 shifted by the ninth flipflop 42, and sequentially noninverts the bit value of the NRZ code NRZ_2 by one bit in accordance with the inverted synchronous signal CLOCK_2.

Thereafter, the NAND-gate 44 receives the bit value of the NRZ code NRZ_2 outputted from the ninth flipflop 42 through one terminal, and receives the bit value of the NRZ code NRZ_2 outputted from the tenth flipflop 43 through the other terminal, and outputs a low level synchronous bit detection signal when the synchronous bit value "1, 1" is detected.

Thereafter, the low level synchronous detection signal is inverted to a high level by the inverter 45 and inputted to the clock terminal of the eleventh flipflop 46, and the eleventh flipflop 46 noninverts the voltage $V_{cc}$, clocked to the output of the inverter 45 and applied to the input terminal D, to the second decoding unit 500 as a synchronous signal SYNC.

Therefore, the latch device 51 of the second decoding unit 500 outputs the NRZ code NRZ_2 outputted from the first multiplexer 31 in accordance with a high level synchronous signal SYNC outputted from the eleventh flipflop 46 and computes the NRZ data NRZ DATA, and the latch 52 outputs the synchronous signal CLOCK_2 outputted from the second multiplexer 32 in accordance with a high level synchronous signal SYNC outputted from the eleventh flipflop 46 and computes the receiving clock signal Rx_CLK, so that the NRZ data NRZ DATA and the synchronous clock signal RX_CLK which are necessary for the system are outputted from a LAN control unit (not shown).

Meanwhile, when the control signal inputted to the strobe terminal S of the first multiplexer 31 and the second multiplexer 32 is a low level, the ninth flipflop 42 of the synchronous bit detection unit 400 receives an NRZ code NRZ_1 outputted from the first multiplexer 31 through the input terminal D thereof and receives the synchronous clock signal outputted from the second multiplexer 32 through the clock terminal thereof through the inverter 41 and sequentially nonconverts the bit value of the NRZ code NRZ_1 in accordance with a synchronous clock signal CLOCK_1, and the tenth flipflop 43 receives the synchronous clock signal CLOCK_1 inverted by the inverter 41 through the clock terminal thereof and sequentially receives the bit value of the NRZ code NRZ_1 shifted by the ninth flipflop 42 and nonconverts the bit value of the NRZ code NRZ_1 by one bit in accordance with an inverted synchronous clock signal CLOCK_1.

Thereafter, the NAND-gate 44 receives the bit value of the NRZ code NRZ_1 outputted from the ninth flipflop 42 through one terminal, and receives the bit value of the NRZ code NRZ_1 outputted from the tenth flipflop through the other terminal, and when the synchronous bit value 1, 1 are detected, the NAND gate 44 outputs a low level signal.

In addition, a low level signal is inverted into a high level by the inverter 45 and inputted to the clock terminal of the eleventh flipflop 46, and the eleventh flipflop 46 outputs voltage Vcc to the second decoding unit 500 as a synchronous detection signal SYNC in accordance with a high level signal outputted from the inverter 45.

Therefore, the latch device 51 of the second decoding unit 500 receives the NRZ code NRZ_1 outputted from the first multiplexer 31 and outputs the NRZ code NRZ_1 in accordance with a high level synchronous signal SYNC outputted from the eleventh flipflop 46, and computes the NRZ data NRZ DATA, and the latch device 52 outputs the synchronous clock signal CLOCK_1 outputted from the second multiplexer 32 in accordance with a high level synchronous signal SYNC outputted from the latch device 52 and computes the synchronous receiving clock signal RX_CLK, and the NRZ data NRZ_DATA and the synchronous receiving clock signal Rx_CLK which are necessary for the system are outputted from the LAN control unit (not shown).

As described above, the decoding apparatus for a Manchester code is directed to decoding the NRZ data and the synchronous receiving clock signal through a more simple circuit construction without adopting a phase-clocked loop (PLL), resolving the disadvantages of a difficult fabrication process and the increasing chip size which are caused due to the use of the delay size, and detecting the synchronous signal which the LAN controller requires.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A decoding apparatus for a Manchester code, comprising:

a first decoding unit for sampling an asynchronous Manchester code by synchronizing the asynchronous Manchester code to a shift of a received clock signal to produce a synchronous Manchester code, computing a synchronous clock signal by dividing the received clock signal by an integer XORing the synchronous Manchester code and the synchronous clock signal, and computing an NRZ code;

a tolerance check unit for receiving the synchronous Manchester code from said first decoding unit, sequentially detecting a tolerance bit value shifted in accordance with the synchronous clock signal, and checking a tolerance with respect to a shift at a bit cell center of the synchronous Manchester code;

a multiplexer unit for receiving the NRZ code and the synchronous clock signal outputted from said first decoding unit and for selectively outputting a multiplexed NRZ code and a multiplexed synchronous clock signal in accordance with a detection signal outputted from said tolerance check unit;

a synchronous signal detection unit for receiving the multiplexed NRZ code and the multiplexed synchronous clock signal outputted from said multiplexer unit and for detecting a synchronous bit value of the multiplexed NRZ code shifted in accordance with the multiplexed synchronous clock signal and for outputting a sync detection signal; and a second decoding unit for receiving the multiplexed NRZ code and the multiplexed synchronous clock signal outputted from said multiplexer unit and for computing the output NRZ data and the output synchronous clock signal in accordance with the sync detection signal outputted from the synchronous signal detection unit.

2. The apparatus of claim 1, wherein said tolerance check unit includes:

a buffer for receiving a check received clock signal and outputting a buffer received clock signal;

a fifth flipflop for receiving the synchronous Manchester code from said first decoding unit and for sequentially shifting the tolerance bit value by one bit in accordance with the buffer received clock signal outputted from said buffer;

a sixth flipflop for receiving the tolerance bit value of the synchronous Manchester code from said fifth flipflop and for sequentially shifting the tolerance bit value by one bit in accordance with the buffer received clock signal outputted from said buffer;

a seventh flipflop for receiving the tolerance bit value of the synchronous Manchester code outputted from said sixth flipflop and for sequentially shifting the tolerance bit value by one bit in accordance with the buffer received clock signal outputted from said buffer;

a NAND-gate for receiving the tolerance bit value shifted by said fifth flipflop, said sixth flipflop, and said seventh flipflop, for detecting whether the synchronous Manchester code is deviated from the tolerance specification of the dubiety, and for outputting a first detection signal;

an inverter for inverting the first detection signal outputted from said NAND gate and for outputting an inverted first detection signal;

a NOR-gate for receiving the tolerance bit value shifted by said detection signal outputted from said NOR-gate, for checking the dubiety specification of the synchronous Manchester code, and for outputting a third detection signal; and an eighth flipflop for outputting voltage to a control signal in accordance with the third detection signal of said OR-gate.

3. The apparatus of claim 2, wherein said NAND-gate is directed to detecting a tolerance bit value "1" shifted at the fifth flipflop, the sixth flipflop, and the seventh flipflop, and said NOR-gate is directed to detecting a tolerance bit value "0,0,0" by receiving the bit value "0" shifted by the fifth flipflop, the sixth flipflop, and the seventh flipflop.

4. The apparatus of claim 3, wherein said dubiety of the synchronous Manchester code deviates from the tolerance specification when the tolerance bit value "1, 1, 1" is detected at the NAND gate or the tolerance bit value "0, 0, 0" is detected at the NOR-gate.

5. The apparatus of claim 1, wherein said multiplexer unit includes:

a first multiplexer for receiving the NRZ code from said first decoding unit and for selectively outputting the multiplexed NRZ code in accordance with a control signal outputted from said tolerance check unit; and a second multiplexer for receiving the synchronous clock signal from said first decoding unit and for selectively outputting the multiplexed synchronous clock signal in accordance with the control signal outputted from said tolerance check unit.

6. The apparatus of claim 5, wherein said first multiplexer outputs the multiplexed NRZ code corresponding to a first NRZ code from said first decoding unit when a low level control signal is inputted thereto from the tolerance check unit, and outputs the multiplexed NRZ code corresponding to a second NRZ code from said first decoding unit when a high level control signal is inputted thereto.

7. The apparatus of claim 5, wherein said second multiplexer outputs the multiplexed synchronous clock signal corresponding to a first synchronous clock signal when a low level control signal is inputted thereto from the tolerance check unit and outputs the multiplexed synchronous clock signal corresponding to a second synchronous clock signal when a high level control signal is inputted thereto.

8. The apparatus of claim 1, wherein said first decoding unit includes:

a first flipflop for sampling the asynchronous Manchester code at an increasing edge of the received clock signal and for outputting the synchronous Manchester code;

a second flipflop for dividing the received clock signal by the integer and for outputting the synchronous clock signal;

a first exclusive OR-gate for XORing the synchronous Manchester code outputted from said first flipflop and the synchronous clock signal outputted from said second flipflop and for outputting an NRZ code;

a third flipflop for sampling the asynchronous Manchester code at an increasing edge of an inverted received clock signal and for outputting a further synchronous Manchester code;

a fourth flipflop for dividing the inverted received clock signal by the integer and for outputting a further synchronous clock signal; and a second exclusive OR-gate for XORing the further synchronous Manchester code outputted from said third flipflop and the further synchronous clock signal outputted from said fourth flipflop and for outputting a further NRZ code.

9. The apparatus of claim 8, wherein said integer is 2.

10. The apparatus of claim 1, wherein said synchronous signal detection unit includes:

an inverter for inverting the multiplexed synchronous clock signal outputted from said multiplexer unit and for outputting an inverted synchronous clock signal;

a ninth flipflop for sequentially shifting the synchronous bit value of the multiplexed NRZ code outputted from the multiplexer by one bit in accordance with the inverted synchronous clock signal;

a tenth flipflop for receiving the synchronous bit value of the multiplexed NRZ code outputted from the ninth flipflop and sequentially shifting the synchronous bit value of the multiplexed NRZ code outputted from the ninth flipflop by one bit in accordance with the inverted synchronous clock signal;

a NAND-gate for NANDing the synchronous bit value outputted from said tenth flipflop and the synchronous bit value outputted from the ninth flipflop and for outputting a detected synchronous bit value;

an inverter for inverting the detected synchronous bit value of said NAND gate; and an eleventh flipflop for outputting voltage as the sync detection signal in accordance with an output signal of said inverter.

11. The apparatus of claim 1, wherein said second decoding unit includes:

a first latch device for receiving the multiplexed NRZ code outputted from said multiplexer unit and for outputting the output NRZ data in accordance with the sync detection signal; and a second latch device for receiving the multiplexed synchronous clock signal outputted from said multiplexer unit and for outputting the output synchronous clock signal in accordance with the sync detection signal.

12. A method for decoding an asynchronous Manchester Code comprising the steps of:

receiving the asynchronous Manchester Code and a received clock signal;

sampling the asynchronous Manchester Code with the received clock signal to produce a synchronous Manchester Code and an NRZ code;

tolerance checking the synchronous Manchester code and outputting a detection signal;

multiplexing the NRZ code in accordance with the detection signal to produce a multiplexed NRZ code;

synchronizing the multiplexed NRZ code to produce a sync detection signal; and outputting an output NRZ data, synchronized with the received clock signal, in accordance with the multiplexed NRZ code and the sync detection signal.

* * * * *